US006960831B2

(12) United States Patent
Burrell et al.

(10) Patent No.: US 6,960,831 B2
(45) Date of Patent: Nov. 1, 2005

(54) SEMICONDUCTOR DEVICE HAVING A COMPOSITE LAYER IN ADDITION TO A BARRIER LAYER BETWEEN COPPER WIRING AND ALUMINUM BOND PAD

(75) Inventors: Lloyd G. Burrell, Poughkeepsie, NY (US); Kwong H. Wong, Wappingers Falls, NY (US); Adreanne A. Kelly, Poughkeepsie, NY (US); Samuel R. McKnight, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/605,369

(22) Filed: Sep. 25, 2003

(65) Prior Publication Data

US 2005/0067708 A1    Mar. 31, 2005

(51) Int. Cl.[7] .............................................. H01L 23/48
(52) U.S. Cl. ....................... 257/751; 257/763; 257/764; 257/781
(58) Field of Search ................................ 257/751, 753, 257/758, 761–765, 779, 781–784

(56) References Cited

U.S. PATENT DOCUMENTS

| 5,391,516 A | 2/1995 | Wojnarowski et al. |
|---|---|---|
| 5,523,626 A | 6/1996 | Hayashi et al. |
| 5,674,781 A * | 10/1997 | Huang et al. ................ 438/629 |
| 6,005,291 A * | 12/1999 | Koyanagi et al. ............ 257/751 |
| 6,187,680 B1 * | 2/2001 | Costrini et al. ............. 438/688 |
| 6,191,023 B1 * | 2/2001 | Chen .......................... 438/612 |
| 6,239,494 B1 * | 5/2001 | Besser et al. ................ 257/762 |
| 6,242,078 B1 | 6/2001 | Pommer et al. ............. 428/290 |
| 6,333,559 B1 * | 12/2001 | Costrini et al. ............. 257/762 |
| 6,350,667 B1 | 2/2002 | Chen et al. |
| 6,410,986 B1 * | 6/2002 | Merchant et al. ........... 257/763 |
| 6,435,398 B2 | 8/2002 | Hartfield et al. ........... 228/10.3 |
| 6,620,720 B1 * | 9/2003 | Moyer et al. ............... 438/612 |
| 2001/0051426 A1 | 12/2001 | Pozder et al. |
| 2002/0068385 A1 | 6/2002 | Ma et al. |

FOREIGN PATENT DOCUMENTS

JP        07-078821      3/1995    ....... H01L 21/3205

* cited by examiner

*Primary Examiner*—Anh Duy Mai
(74) *Attorney, Agent, or Firm*—Ira D. Blecker

(57) ABSTRACT

A semiconductor device, and a method of fabricating the device, having a copper wiring level and an aluminum bond pad above the copper wiring level. In addition to a barrier layer which is normally present to protect the copper wiring level, there is a composite layer between the aluminum bond pad and the barrier layer to make the aluminum bond pad more robust so as to withstand the forces of bonding and probing. The composite layer is a sandwich of a refractory metal and a refractory metal nitride.

12 Claims, 3 Drawing Sheets

SEMICONDUCTOR DEVICE HAVING A COMPOSITE LAYER IN ADDITION TO A BARRIER LAYER BETWEEN COPPER WIRING AND ALUMINUM BOND PAD

BACKGROUND OF INVENTION

The present invention relates to the field of semiconductor device contact pads and, more particularly, relates to the enhancement of such semiconductor device contact pads to withstand the forces of probing and bonding.

Semiconductor devices such as integrated circuit chips and the like typically have contact pads for connection to a conventional package. Electrical connections can be made by a variety of means between these contact pads and the package. A robust contact pad for wire bonding would be desirable.

Moreover, as part of the semiconductor device manufacturing process, the contact pads are probed for electrical testing, in some cases a number of times. As noted in Wojnarowski et al. U.S. Pat. No. 5,391,516, the disclosure of which is incorporated by reference herein, such probing can result in varying degrees of probe damage to the contact pads. Where the wiring of the semiconductor device is copper, damage to the contact pad can expose the copper wiring to the atmosphere, resulting in the degradation of the electrical properties of such exposed copper wiring and hence the semiconductor device as well. Accordingly, it would be desirable to have a robust contact pad to withstand the rigors of probing as well.

Various solutions have been proposed for enhancing the reliability and robustness of semiconductor device contact pads.

Chen et al. U.S. Pat. No. 6,350,667, the disclosure of which is incorporated by reference herein, discloses a method of improving contact pad adhesion wherein a thin (50 to 80 angstroms) aluminum layer is inserted between a tantalum nitride barrier layer and the underlying copper wiring. The object of this invention is to improve the adhesion of the contact pad metal stack.

Hayashi et al. U.S. Pat. No. 5,523,626, the disclosure of which is incorporated by reference herein, discloses a titanium nitride/titanium/titanium nitride composite adhesion layer for bonding the aluminum contact pad to the upper interlayer insulation layer. The object of this invention is to improve the adhesion of the aluminum contact pad to the interlayer insulation layer.

Ma et al. U.S. Published Patent Application U.S. 2002/0068385, the disclosure of which is incorporated by reference herein, discloses an aluminum contact pad anchored to the underlying structure by tungsten or titanium vias. The object of this invention is to avoid delamination of the contact pad.

Pozder et al. U.S. Published Patent Application U.S. 2001/0051426, the disclosure of which is incorporated by reference herein, discloses a composite contact pad over a copper wiring level comprising dielectric columns within the contact pad area and aluminum over and between the dielectric columns. There is also a barrier layer such as tantalum, titanium, chromium or nitrides thereof to prevent contact between the aluminum contact pad and the copper wiring. The object of this invention is to have a mechanically robust contact pad to withstand test and probe operations.

In view of the various solution proposed by those skilled in the art, it is a purpose of the present invention to have a semiconductor device contact pad and method of forming therefore that does not have the drawbacks or shortcomings of the prior art.

It is a further purpose of the present invention to have a semiconductor device contact pad and method of forming therefore which is robust and able to withstand the rigors of wire bonding and test and probing operations.

It is yet another purpose of the present invention to have a semiconductor device contact pad and method of forming therefore which protects the underlying copper wiring.

These and other purposes of the present invention will become more apparent after referring to the following description of the invention considered in conjunction with the accompanying drawings.

SUMMARY OF INVENTION

The purposes of the invention have been achieved by providing, according to a first aspect of the invention, a semiconductor device comprising:

a semiconductor base;

at least one copper wiring level on the semiconductor base;

a barrier layer on, and in direct contact with, the copper wiring level; an aluminum bond pad on the barrier layer; and a composite layer in addition to the barrier layer between the aluminum bond pad and the barrier layer wherein the composite layer comprises a refractory metal and a refractory metal nitride.

According to a second aspect of the invention, there is provided a method of manufacturing a semiconductor device comprising the steps of: forming a semiconductor base;

forming at least one copper wiring level on the semiconductor base;

forming a barrier layer on, and in direct contact with, the copper wiring level;

forming a composite layer on the barrier layer wherein the composite layer comprises a refractory metal and a refractory metal nitride; and forming an aluminum bond pad on the composite layer.

BRIEF DESCRIPTION OF DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
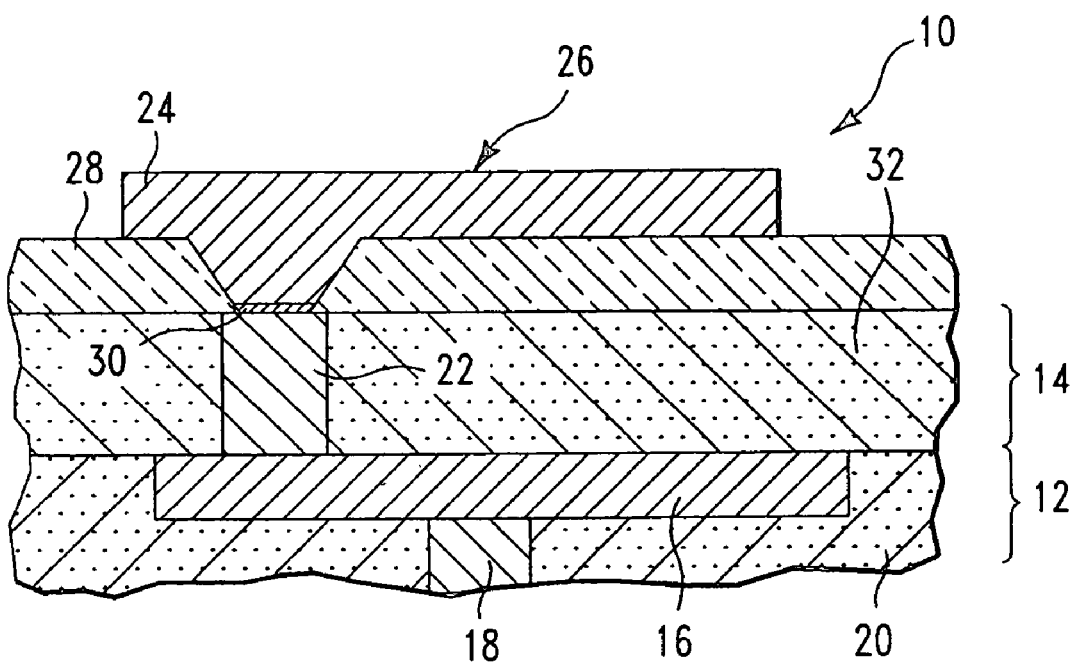
FIG. 1 is a cross sectional view of a portion of a first semiconductor device showing a conventional arrangement of an aluminum wire bond pad joined to underlying copper wiring.

Referring to the drawings in more detail, and particularly referring to FIG. 1, there is a cross sectional view of a portion of a conventional semiconductor device 10 comprising the last two levels of metallization 12, 14. The level of metallization designated by reference numeral 12 comprises wiring metallization 16, via metallization 18 (which connects to the wiring level immediately below, not shown) and interlevel dielectric (ILD) 20. Wiring level 14 comprises a via 22 and ILD 32. Wiring metallization 16 and vias 18, 22 are copper. In this particular embodiment of the semiconductor device 10, there is no wiring metallization in level 14. Joined to via 22 is a wire bond pad 24, generally comprising aluminum, which is initially used for probing/testing and thereafter is used for wire bonding. The wire bond pad 24 is offset as indicated by arrow 26 to allow for probing/testing away from the underlying copper metallization. Between the wire bond pad 24 and ILD 32 there will usually be dielectric material 28. To avoid direct contact between the wire bond pad 24 and the via 22, there will usually be a conventional barrier layer 30.

The problem encountered with the semiconductor device 10 structure shown in FIG. 1 is that during probing or other testing, the wire bond pad can be gouged out or removed, resulting in a failure of the part because of the reduced area for bonding and current carrying.

Figure 2:
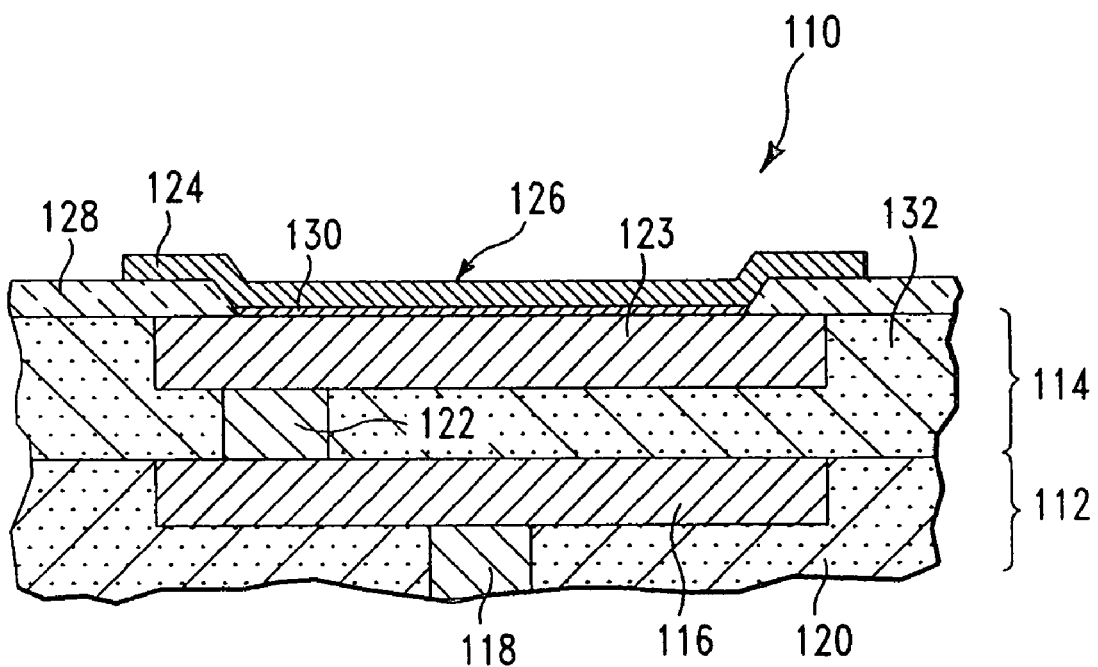
FIG. 2 is a cross sectional view of a portion of a second semiconductor device showing a conventional arrangement of an aluminum pad joined to underlying copper wiring.

Referring now to FIG. 2, there is shown a cross sectional view of a portion of a conventional semiconductor device 110 having wiring levels 112, 114, representing the last two wiring levels. Wiring level 112 comprises ILD 120 and copper metallization consisting of a copper wiring line 116 and copper via 118. Wiring level 114 similiarly comprises ILD 132 and copper wiring line 123 and copper via 122. Joined to wiring line 123 is bond pad 124, usually aluminum, having a probing/testing area 126. Between the bond pad 124 and copper wiring line 123/ILD 132 is dielectric material 128. Again, to avoid direct contact between the bond pad 124 and the copper wiring line 123, there will usually be a conventional barrier layer 130.

As with the embodiment 10 shown in FIG. 1, the problem encountered with the semiconductor device 10 structure shown in FIG. 1 is that during probing or other testing, the wire bond pad can be gouged out or removed, resulting in a failure of the part because of the reduced area for bonding and current carrying. In this instance, the copper wiring line 123 will be exposed to the atmosphere which is a reliability risk.

The nominal thickness of the aluminum bond pads in FIGS. 1 and 2 is about 0.5 to 2.0 microns.

As noted above, there is a conventional barrier layer 30, 130 between the last copper metallization and the bond pad. This conventional barrier layer 30, 130 is usually tantalum nitride (TaN) but can also include a sandwich of TaN and then tantalum (Ta) or a sandwich of TaN, then titanium (Ti) and lastly titanium nitride (TiN). This conventional barrier layer 30, 130 may be on the order of 500–1000 angstroms and is suitable for separating the copper metallization from the aluminum bond pad but is not robust enough to protect the underlying layer (i.e., the dielectric material 28 in FIG. 1 or the copper wiring line 123 in FIG. 2).

Figure 3:
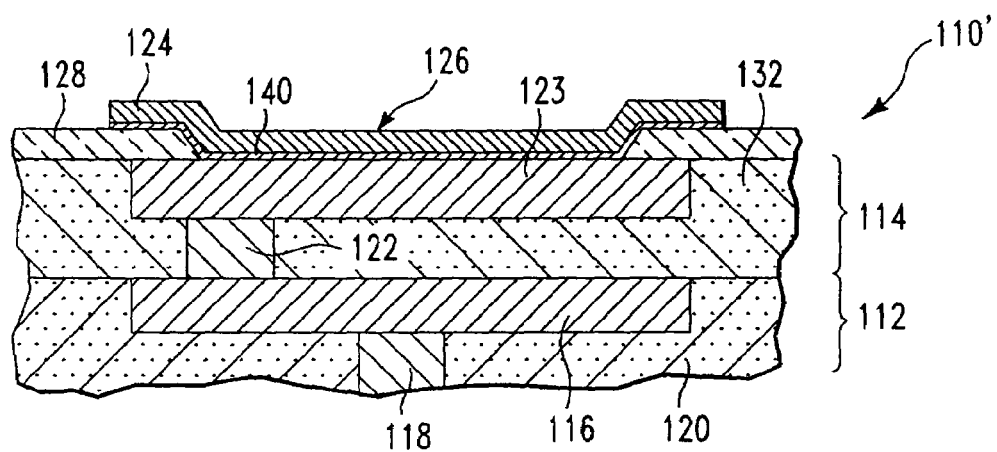
FIG. 3 is a cross sectional view of a portion of the second semiconductor device of FIG. 2 showing an arrangement of an aluminum pad joined to underlying copper wiring with an intervening composite layer.

Referring now to FIG. 3, there is shown a first embodiment of the present invention. FIG. 3 is similar to FIG. 2 except that FIG. 3 now includes a composite layer 140 which comprises a refractory metal, such as titanium (Ti), tantalum or tungsten (W) and a refractory metal nitride, such as TiN, TaN or tungsten nitride (WN). The preferred combinations are Ti/TiN or Ta/TaN. In a preferred embodiment, the composite layer 140 is entirely underneath the bond pad 124, not just where the bond pad makes contact with the copper wiring line 123, because of ease of manufacture and it doesn't preclude where the probe will be allowed to land on the bond pad 124.

Figure 4:
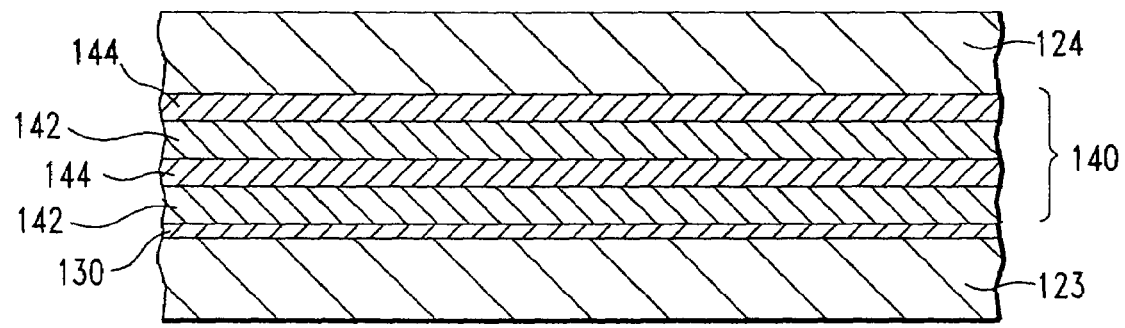
FIG. 4 is an enlargement of the composite layer of FIG. 3.

An enlarged view of the composite layer 140 is shown in FIG. 4. Conventional barrier layer 130 makes initial contact with the copper wiring line 123 and then is followed by several alternating layers of refractory metal 142 and refractory metal nitride 144 directly on the conventional barrier layer 130, for example, Ti/TiN/Ti/TiN. The refractory metal 142 should be put down prior to the refractory metal nitride 144 because the refractory metal is more reactive and has better adhesion than the refractory metal nitride. There will preferably be at least two layers of each of the refractory metal and refractory metal nitride. Most preferably, the composite layer 140 will have a thickness on the order of 800–2000 angstroms. This thickness, in addition to the thickness of about 500–1000 angstroms for the conventional barrier layer 130, enables the semiconductor device 110' to withstand the rigors of probing/testing because if the aluminum bond pad 124 is gouged or removed during probing/testing, the composite layer 140 provides a robust interface to protect the underlying copper wiring line 123.

Figure 5:
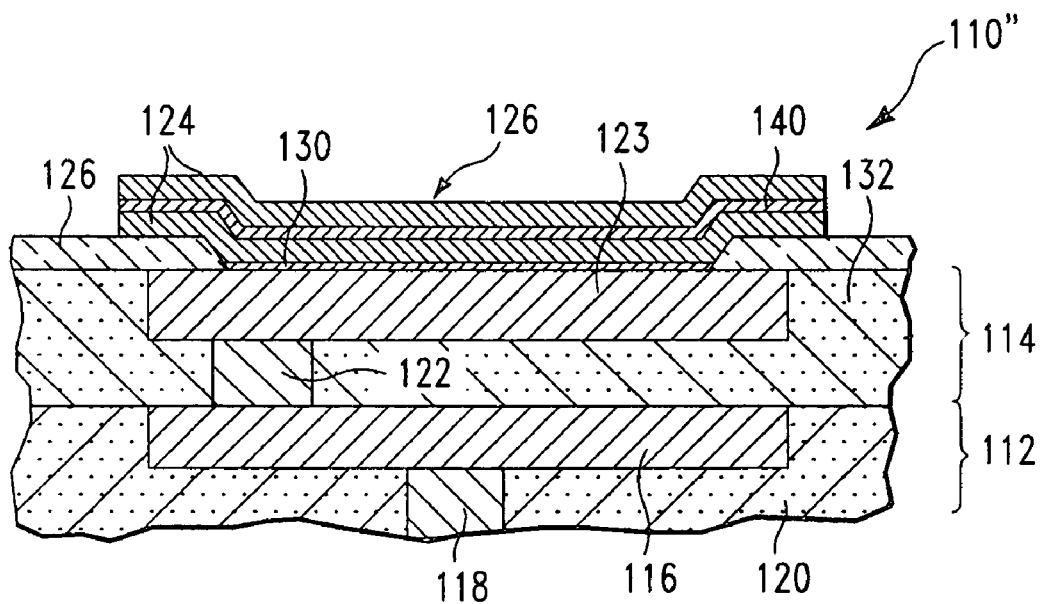
FIG. 5 is a cross sectional view of a portion of the second semiconductor device of FIG. 2 showing an arrangement of an aluminum pad joined to underlying copper wiring with a composite layer within the aluminum pad.

Turning now to FIG. 5, there is shown a second embodiment 110" of the present invention. Semiconductor device 110" is similar to semiconductor device 110" shown in FIG. 3, except that the composite layer 140 is now contained wholly within the aluminum bond pad 124. In this embodiment of the present invention, it is the aluminum bond pad 124 that makes direct contact with the conventional barrier layer 130. The thickness of the composite layer 140 is most preferably about 800–2000 angstroms thick. At least 3000–6000 angstroms of aluminum is needed on top of the aluminum bond pad 124 for bonding wire (usually gold) to form a robust intermetallic with the aluminum bond pad 124. The composite layer 140 can then be located below the top 3000–6000 angstroms of the aluminum bond pad 124. Preferably, the composite layer 140 comprises several alternating layers of refractory metal and refractory metal nitride and preferably there are at least two layers of each of the refractory metal and refractory metal nitride. Composite layer 140 enables the aluminum bond pad 124 to withstand the rigors of probing/testing because if the aluminum bond pad 124 is gouged or partially removed during probing/testing, the composite layer 140 provides a robust interface to protect the remainder of the aluminum bond pad 124 as well as the underlying copper wiring line 123.

The advantage of having the composite in the middle of the aluminum bond pad 124 is that the composite will prevent the probe damage from depleting aluminum form the bottom half of the aluminum bond pad 124, thus assuring that the aluminum bond pad 124 can still support some level of current. With the composite layer at the bottom of the aluminum bond pad 124, should the probing deplete the aluminum above, then all that is left to carry the current is the composite layer and the conventional liner below. A further advantage to this embodiment of the present invention is that if the last level is utilized for bonding only (as opposed to bonding and wiring), then the thickness of the aluminum can be reduced because bonding pads have large area and the resistance increase is minimal compared to the overall resistance of the net.

Figure 6:
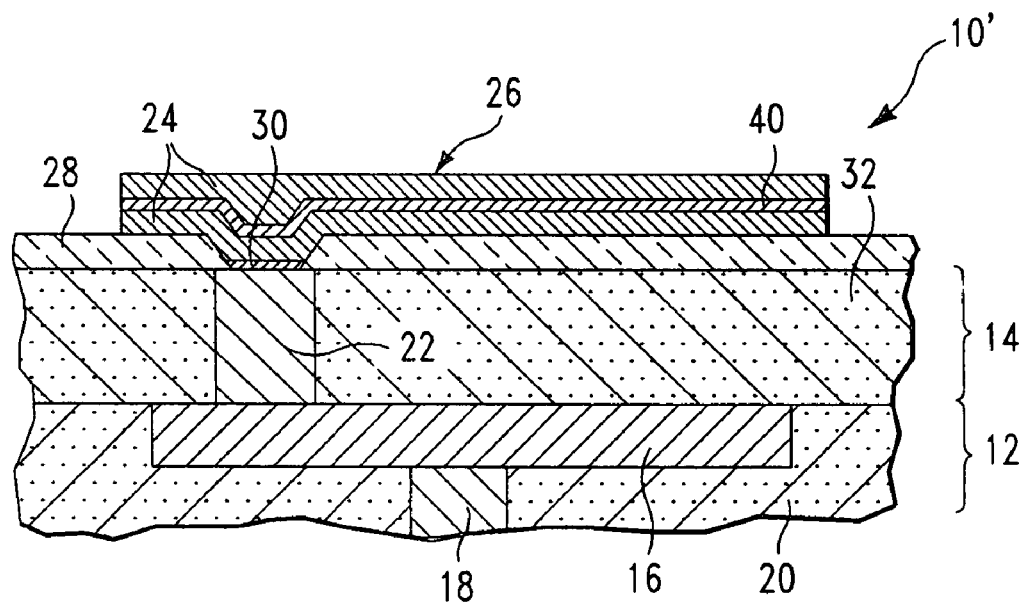
FIG. 6 is a cross sectional view of a portion of the first semiconductor device of FIG. 1 showing an arrangement of an aluminum pad joined to underlying copper wiring with a composite layer within the aluminum pad.

The last embodiment of the present invention is illustrated in FIG. 6. Semiconductor device 10' is similar to semiconductor device 10 shown in FIG. 1 except that semiconductor device 10' comprises a composite layer 40. Composite layer 40 is similar to composite layer 140 discussed previously with respect to semiconductor device 110" in that composite layer 40 is contained wholly within the aluminum bond pad 24. Composite layer 40 enables the wire bond pad 24 to withstand the rigors of probing/testing because if the aluminum bond pad 24 is gouged or partially removed during probing/testing, the composite layer 40 provides a robust interface to protect the remainder of the aluminum bond pad 24 as well as the underlying dielectric material 28.

In the above described embodiments, only the last two levels of copper wiring were shown. It should be understood that there will usually be several more layers of copper wiring as well as tungsten interconnects to the silicon, all of which are not shown for clarity.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A semiconductor device comprising:
   a semiconductor base;
   at least one copper wiring level on the semiconductor base;
   a barrier layer having a first thickness on, and in direct contact with, the copper wiring level;
   an aluminum bond pad on the barrier layer; and a composite layer having a second thickness in addition to the barrier layer wherein the composite layer is within the aluminum pad and spaced from the barrier layer, wherein the composite layer comprises a refractory metal and a refractory metal nitride and wherein the second thickness is greater than the first thickness.

2. The semiconductor device of claim 1 wherein the composite layer comprises alternating layers of the refractory metal and the refractory metal nitride and there are at least two layers of each of the refractory metal and the refractory metal nitride.

3. The semiconductor device of claim 1 wherein the barrier layer is selected from the group consisting of tantalum nitride, tantalum nitride/tantalum and tantalum nitride/titanium/titanium nitride.

4. The semiconductor device of claim 3 wherein the thickness of the barrier layer is 500 to 1000 angstroms.

5. The semiconductor device of claim 1 wherein the refractory metal of the composite layer is selected from the group consisting of tantalum, titanium and tungsten and the refractory metal nitride of the composite layer is selected from the group consisting of tantalum nitride, titanium nitride and tungsten nitride.

6. The semiconductor device of claim 1 wherein the thickness of the aluminum bond pad is 0.5 to 2.0 microns.

7. The semiconductor device of claim 1 wherein the refractory metal of the composite layer is tantalum and the refractory metal nitride is tantalum nitride.

8. The semiconductor device of claim 1 wherein the refractory metal of the composite layer is titanium and the refractory metal nitride is titanium nitride.

9. The semiconductor device of claim 1 wherein the refractory metal of the composite layer is tungsten and the refractory metal nitride is tungsten nitride.

10. The semiconductor device of claim 1 wherein the composite layer is 1000 angstroms thick.

11. A semiconductor device comprising:
    a semiconductor base;
    at least one copper wiring level on the semiconductor base;
    a barrier layer having a first thickness on, and in direct contact with, the copper wiring level;
    an aluminum bond pad on the barrier layer; and
    a composite layer having a second thickness in addition to the barrier layer wherein the aluminum bond pad comprises first and second layers of aluminum and the composite layer is interposed between the first and second layers, wherein the composite layer comprises a refractory metal and a refractory metal nitride and wherein the second thickness is greater than the first thickness.

12. The semiconductor device of claim 11 wherein one of the first and second layers of the aluminum bond pad is in direct contact with the barrier layer.

* * * * *